(12) United States Patent
Horikawa et al.

(10) Patent No.: US 6,300,680 B1
(45) Date of Patent: Oct. 9, 2001

(54) SEMICONDUCTOR SUBSTRATE AND MANUFACTURING METHOD THEREOF

(75) Inventors: Mitsuhiro Horikawa; Masahito Watanabe, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/073,762

(22) Filed: May 7, 1998

(30) Foreign Application Priority Data

May 9, 1997 (JP) .................................................. 9-119419

(51) Int. Cl.[7] .................................................. H01L 23/58
(52) U.S. Cl. .......................... 257/751; 257/608; 257/682; 257/913; 257/49
(58) Field of Search .................................. 257/608, 682, 257/751, 913, 49

(56) References Cited

U.S. PATENT DOCUMENTS

| | | | |
|---|---|---|---|
| 5,170,242 | * 12/1992 | Stevens et al. | 257/751 |
| 5,173,440 | * 12/1992 | Tsunashima | 437/164 |
| 5,189,508 | * 2/1993 | Tachimori et al. | 257/49 |

FOREIGN PATENT DOCUMENTS

| | | | |
|---|---|---|---|
| 59-186331 | 10/1984 | (JP) . | |
| 1-235242 | * 9/1989 | (JP) | H01L/21/322 |
| 3-273639 | * 12/1991 | (JP) | H01L/21/322 |
| 5-286795 | * 2/1993 | (JP) | C30B/29/06 |
| 6-140410 | 5/1994 | (JP) . | |

\* cited by examiner

*Primary Examiner*—Eddie Lee
*Assistant Examiner*—Matthew E. Warren
(74) *Attorney, Agent, or Firm*—Sughrue, Mion, Zinn, Macpeak & Seas, PLLC

(57) ABSTRACT

A semiconductor substrate is provided which maintains its gettering capabilities throughout the manufacturing process of a semiconductor device and which prevents previously gettered contaminating impurities from being released again into an operating region of a semiconductor device. The semiconductor substrate includes a silicon substrate, a polysilicon layer, and a high density boron layer. The silicon substrate has a first main surface and a second main surface opposed to the first main surface, and the silicon substrate is used to form a semiconductor device at least indirectly on the first main surface. The polysilicon film is formed at least indirectly on the second main surface, and the high density boron layer is disposed between the silicon substrate and the polysilicon film. Also a ratio of a highest boron density value in the high density boron layer to a lowest boron density value in the silicon substrate is greater than or equal to approximately 100. Instead of using the high density boron layer, other layers may be used such as silicon oxide layers or polysilicon layers. Also, a method for manufacturing the semiconductor substrate is also provided.

19 Claims, 6 Drawing Sheets

TO USUAL MANUFACTURING STEPS OF SEMICONDUCTOR DEVICE

SEMICONDUCTOR SUBSTRATE AND MANUFACTURING METHOD THEREOF

FIELD OF THE INVENTION

The present invention relates to a semiconductor substrate used for manufacturing a semiconductor device and relates to a method for manufacturing the substrate.

BACKGROUND OF THE INVENTION

As the level of integration of semiconductor devices using silicon substrates increases, the p-n junction leakage current must be reduced. One factor which contributes to the leakage current is the amount of impurities of heavy metals (e.g. iron, nickel, and copper) which are induced during manufacturing process of the semiconductor devices. In order to remove the heavy metal impurities from the operating region of a semiconductor device and capture the impurities, various gettering methods have been used.

In one gettering method, a polysilicon film is formed on the rear face of a silicon substrate having a first main surface and a second main surface (i.e. the rear face) which opposes the first main surface. By forming the polysilicon film on the rear face of the silicon substrate, the polysilicon film absorbs various impurities from the silicon substrate. Afterwards, a semiconductor device is formed on the first main surface of the silicon substrate, and the impurities which have been absorbed by the polysilicon film do not diffuse towards and contaminate the operating region of the semiconductor device. An example of such method is disclosed in Japanese Patent Laid-Open Sho 59-186331.

The above gettering method was presumed to be effective even after applying a high temperature heat treatment to the semiconductor substrate when a semiconductor device is formed on the substrate. Recently, however, it has become known that the contaminating elements which have been previously gettered by the polysilicon film are released from the film and diffuse io into the operating region of the semiconductor device when the device is heated to 1000° C. or higher and that the polysilicon is subsequently recrystallized during the high temperature heat treatment at 1200° C. When the polysilicon film recrystallizes, its gettering capabilities are eliminated, and thus, it cannot re-absorb the impurities which have been released. Therefore, the advantages obtained from the initial gettering process are subsequently lost.

In order to overcome such problem, several methods have been developed to prevent the polysilicon film from recrystallizing during the manufacturing process of a semiconductor device. One such method is disclosed in Japanese Patent Laid-Open Hei 5-286795 and suppresses the recrystallization of polysilicon by creating a silicon oxide film between the polysilicon film and the silicon substrate. However, although various metals (e.g. copper) can permeate through the silicon oxide film and can be absorbed by the polysilicon film, other metals (e.g. iron) cannot easily permeate through the silicon oxide film to reach the polysilicon film. Therefore, the polysilicon film cannot adequately getter the iron impurities, and such impurities remain in the silicon substrate while a semiconductor device is manufactured. As a result, the impurities diffuse towards and contaminate the operating region of the semiconductor device.

Japanese Patent Laid-Open Hei 1-235242 describes another method for suppressing the recrystallization of polysilicon by ion implanting impurities (e.g. nitrogen, oxygen, or argon) into the silicon substrate before forming the polysilicon film on the substrate. Although this method can suppress the recrystallization of polysilicon, no heat treatment is performed on the impurities that are implanted into the silicon substrate. As a result, no clusters or dislocations are formed from the implanted impurities in the silicon substrate, and thus, the method cannot prevent the contaminating elements and heavy metals which have previously been gettered from being released again into the operating region of the semiconductor device during the manufacture of the semiconductor device.

In Japanese Patent Laid-Open Hei 6-140410, a method for gettering heavy metals has been proposed in which the polysilicon film is removed before the contaminating elements are re-released into the operating region of the semiconductor device and before the polysilicon is recrystallized. For example, the polysilicon film is formed on the semiconductor substrate, various impurities are gettered, and the polysilicon film is removed before the impurities are released back into the silicon substrate. During a subsequent step of the manufacturing process of a semiconductor device, another polysilicon film is formed on the semiconductor substrate, various impurities are gettered, and the polysilicon film is removed before the impurities are released back into the silicon substrate. Such process is repeated several times while the semiconductor device is being manufactured.

However, heavy metal impurities may possibly intrude into the operating region between the first stage and the last stage of the manufacturing process of the semiconductor device. Therefore, since the gettering capabilities of the polysilicon film are lost when the film is removed, the characteristics of the semiconductor device may be degraded if impurities are present in the silicon substrate during the periods when the film is not present on the substrate. Also, the repeated formation and removal of polysilicon film on the silicon substrate increase the time and cost of manufacturing a semiconductor device.

SUMMARY OF THE INVENTION

The various methods and devices described above are not able to maintain the gettering capabilities throughout the entire manufacturing process of the semiconductor device. Also, they cannot prevent contaminating impurities that have been previously gettered to a polysilicon film from being released again into the operating region of the semiconductor device.

Accordingly, an object of the present invention to provide a semiconductor substrate which maintains its gettering capabilities throughout the manufacturing process of a semiconductor device and which prevents gettered contaminating impurities from being released again into the operating region of a semiconductor device.

Another object of the present invention is to provide a method for manufacturing a semiconductor substrate which maintains its gettering capabilities throughout the manufacturing process of a semiconductor device and which prevents gettered contaminating impurities from being released again to the operating region of a semiconductor device.

In order to achieve the above and other objects, a semiconductor substrate is provided. The semiconductor substrate comprises: a silicon substrate having a first main surface and a second main surface opposed to said first main surface, wherein said silicon substrate is used to form a semiconductor device at least indirectly on said first main surface; a polysilicon film formed at least indirectly on said second main surface; a high density boron layer disposed between said silicon substrate and said polysilicon film, wherein a ratio of a highest boron density value in said high density boron layer to a lowest boron density value in said silicon substrate is greater than or equal to approximately 100.

In order to further achieve the above and other objects, a method for manufacturing a semiconductor substrate is provided. The method comprises the steps of: (a) providing a silicon substrate having a first main surface and a second main surfaces opposed to said first main surface, wherein said silicon substrate is used to form a semiconductor device at least indirectly on said first main surface; (b) forming a polysilicon film at least indirectly on said second main surface; (c) forming a high density boron layer between said silicon substrate and said polysilicon film, wherein a ratio of a highest boron density value in said high density boron layer to a lowest boron density value in said silicon substrate is greater than or equal to approximately 100.

In order to additionally achieve the above and other objects, a semiconductor substrate is provided. The semiconductor substrate comprises: a silicon substrate having a first main surface and a second main surface opposed to said first main surface, wherein said silicon substrate is used to form a semiconductor device at least indirectly on said first main surface; a polysilicon film formed on said second main surface; a silicon oxide film having a depleted region formed between said silicon substrate and said polysilicon film.

In order to still further achieve the above and other objects, a method for manufacturing a semiconductor substrate is provided. The method comprises the steps of: (a) providing a silicon substrate having a first main surface and a second main surfaces opposed to said first main surface, wherein said silicon substrate is used to form a semiconductor device at least indirectly on said first main surface; (b) forming a polysilicon film on said second main surface; and (c) forming a silicon oxide film having a depleted region between said silicon substrate and said polysilicon film.

In order to even further achieve the above and other objects, a semiconductor substrate is provided. The semiconductor substrate comprises: a silicon substrate having a first main surface and a second main surface opposed to said first main surface, wherein said silicon substrate is used to form a semiconductor device at least indirectly on said first main surface; a polysilicon layer containing a plurality of silicon oxide clusters formed at least indirectly on said second main surface of said silicon substrate; and a polysilicon film formed at least indirectly on said polysilicon layer.

In order to additionally achieve the above and other objects, a method for manufacturing a semiconductor substrate is provided. The method comprises the steps of: (a) providing a silicon substrate having a first main surface and a second main surfaces opposed to said first main surface, wherein said silicon substrate is used to form a semiconductor device at least indirectly on said first main surface; (b) forming a polysilicon layer containing plurality of silicon oxide clusters at least indirectly on said second main surface; and (c) forming a polysilicon film at least indirectly on said polysilicon layer.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
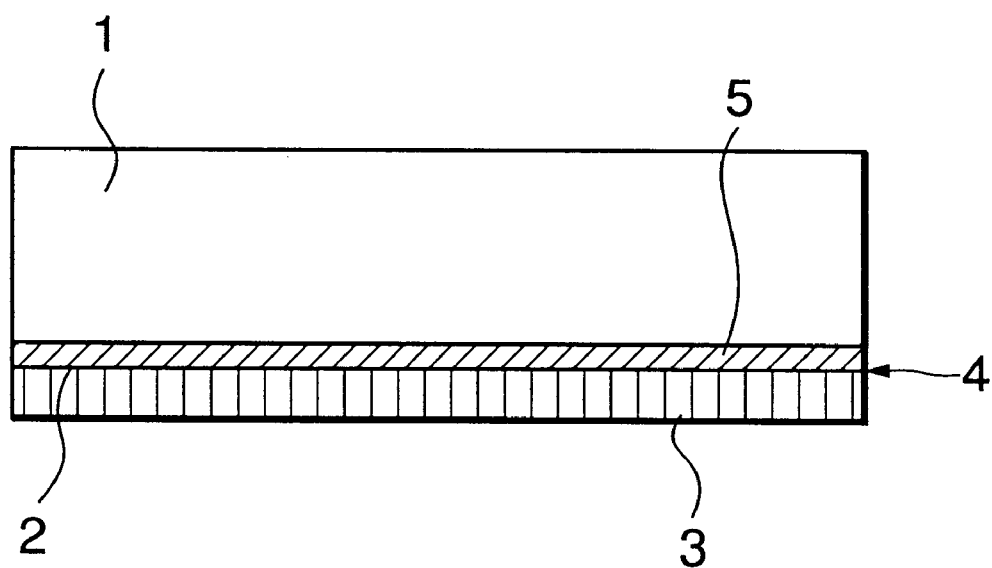
FIG. 1 is a cross sectional view of a semiconductor substrate according to a first embodiment of the present invention.

The following description of the preferred embodiments discloses specific configurations and values. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations and values of the present invention which would have been known to one skilled in the art are omitted for the sake of clarity and brevity.

In the present invention, a main gettering function is provided by a polysilicon film. However, if the gettering function is only provided by the polysilicon film, contaminating impurities which have been previously gettered by the polysilicon film may be released again into the operating region of the semiconductor device when the polysilicon film recrystallizes. Instead of attempting to prevent the polysilicon film from recrystallizing, the present invention provides a barrier layer between the polysilicon film and the silicon substrate which allows heavy metal impurities to pass from the silicon substrate to the polysilicon film but which prevents the heavy metal impurities from passing from the polysilicon film to the substrate when the polysilicon film recrystallizes.

In the first and second aspects of the present invention, a high density boron layer is formed near the boundary between the silicon substrate and the polysilicon film in order to prevent the release of impurities from diffusing into the silicon substrate when the polysilicon film recrystallizes. The solid-solubility of contaminant impurities such as heavy metals (e.g. iron and copper) is increased as the boron density is higher. Thus, by creating the high density boron layer near the boundary between the polysilicon film and the silicon substrate, the contaminating impurities can be prevented from being released again from the polysilicon film into the operating region of the semiconductor device when the polysilicon film recrystallizes.

Also, in the third and the fourth aspects of the present invention, a silicon oxide film having a depleted region is formed at the boundary between the silicon substrate and the polysilicon film to prevent the release of heavy metal impurities from diffusing into the silicon substrate when the polysilicon film recrystallizes. In the fifth and sixth aspects of the present invention, a silicon oxide film having a depleted region and a plurality of dislocations are formed at the boundary between the silicon substrate and the polysilicon film to prevent the release of heavy metal impurities from diffusing into the silicon substrate when the polysilicon film recrystallizes. In the seventh and eighth aspects of the present invention, a polysilicon layer containing a plurality of minute silicon oxide clusters is formed at the boundary between the silicon substrate and the polysilicon film to prevent the release of heavy metal impurities from diffusing into the silicon substrate when the polysilicon film recrystallizes. In the structures described above, a plurality of dislocations and/or the minute silicon oxide clusters are provided in the polysilicon layer at the boundary between the silicon substrate and the polysilicon film and perform a gettering function. Therefore, the release of the contaminating impurities from the polysilicon film to the operating regions of the semiconductor device can be prevented when the polysilicon recrystallizes.

FIG. 1 illustrates a semiconductor substrate according to a first embodiment of the present invention. The semiconductor substrate comprises a silicon substrate 1 having a first main surface and a second main surface (i.e. rear face) 2 opposed to the first main surface, a polysilicon film 3, and a high density boron layer 5 formed at the boundary 4 of the silicon substrate 1 and the polysilicon film 3. The first main surface of the silicon substrate 1 is used to form a semiconductor device on the semiconductor substrate. In the present embodiment, a Czochralski-grown p-type silicon substrate doped with p-type impurities is used as the silicon substrate 1.

The high density boron layer 5 is formed by implanting boron ions B$^+$ near the boundary 4 between the silicon substrate 1 and the polysilicon film 3 such that the layer 5 is formed in the silicon substrate 1. Also, implanting some boron ions B$^+$ in the polysilicon film 3 may have a gettering effect, but the portion of the layer 5 having the highest boron density is preferably located closer to the silicon substrate 1 than to the boundary 4 between the film 3 and the layer 5. Also, the highest boron density in the high density boron layer 5 is 100 times or more than the lowest boron density in the silicon substrate 1. Furthermore, the high density boron layer 5 has a thickness between 1 to 5 $\mu$m, and the highest boron density in the high density boron layer 5 is preferably $1 \times 10^{16}/cm^3$ or higher.

The high density boron layer 5 acts as a barrier layer which enables heavy metal and other impurities to diffuse from the substrate 1 to the polysilicon film 3 to be absorbed by the film 3. Also, if and when the film 3 recrystallizes, the layer 5 prevents the impurities released from the film 3 from migrating back into the silicon substrate 1. Thus, the impurities do not contaminate the operating region of a semiconductor device when the device is formed on the substrate 1.

FIG. 2 shows an illustrative example of the manner in which the semiconductor substrate shown in FIG. 1 is manufactured. First, a polysilicon film 3 having a thickness of approximately 1 $\mu$m is formed on the rear face (i.e. second main surface) 2 of the silicon substrate 1 (FIG. 2a). As shown in FIG. 2a, the polysilicon film 3 is formed directly on the silicon substrate 1. However, after reading the specification, one skilled in the art would clearly realize that the polysilicon film 3 can be formed indirectly on the silicon substrate 1 such that other semiconductor layers or devices are disposed between the film 3 and the substrate 1. Also, other films and layers in the present embodiment (and in the other embodiments disclosed in the specification) can be formed indirectly on various films and layers. Then, a resist for photolithography (i.e. a photoresist) 6 is formed on the first main surface of the silicon substrate 1 (FIG. 2b).

Figure 2A:
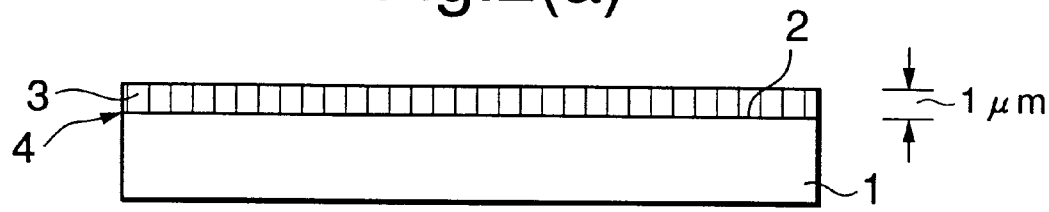
FIG. 2 illustrates a process for manufacturing the semiconductor substrate shown in FIG. 1.
Figure 2B:
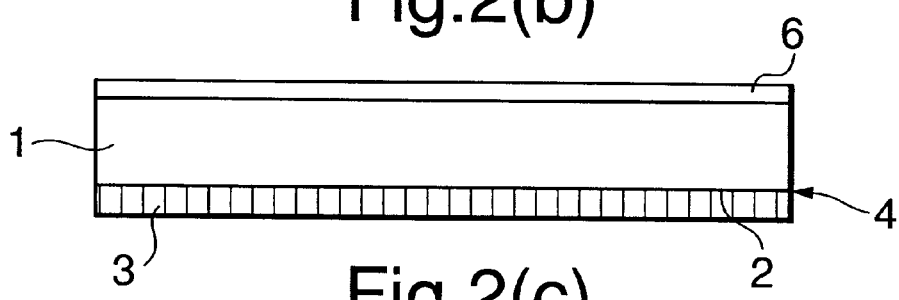
Figure 2C:
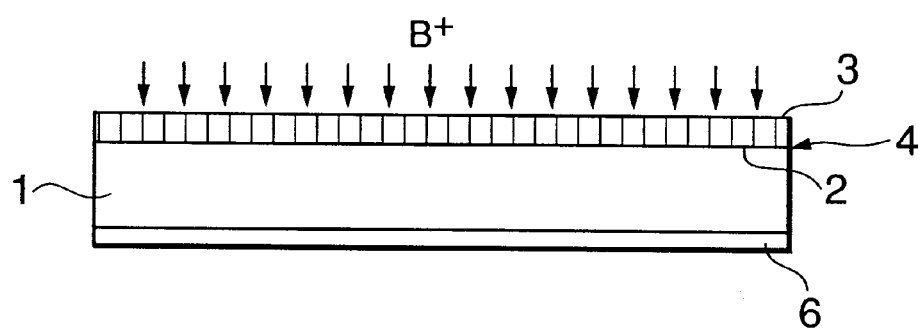
Figure 2D:
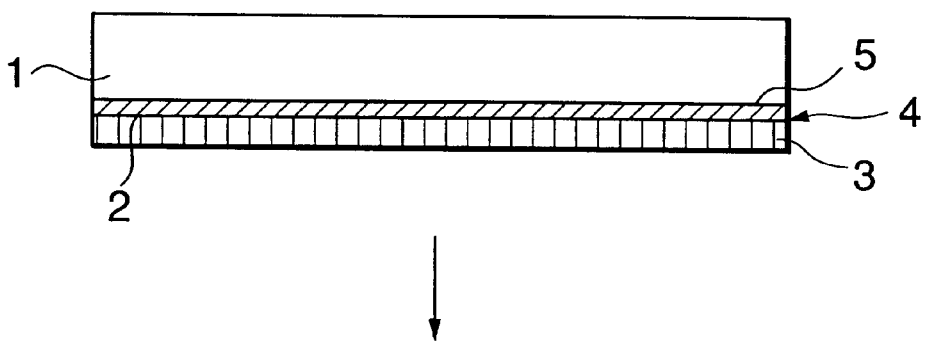

Afterwards, boron ions B$^+$ are ion implanted through the polysilicon film 3 (FIG. 2c) to form a high density boron layer 5 near the boundary 4 between the silicon substrate 1 and the polysilicon film 3 (FIG. 2d). The value of the acceleration energy for the implanted boron ions B$^+$ is set so that the portion of the high boron density layer 5 having the highest boron density is located on the silicon substrate side of the boundary 4. Furthermore, the ion implantation and a heat treatment are applied such that the highest boron density in the high density boron layer 5 is 100 times or more than the lowest boron density in the silicon substrate 1.

After the high density boron layer 5 is formed, the photoresist 6 is removed from the first main surface of the silicon substrate 1 (FIG. 2d). Then, a semiconductor device (not shown) is formed on the first main surface of the silicon substrate 1 via a typical process for manufacturing semiconductor devices.

In order to illustrate the advantages of the semiconductor substrate illustrated in FIG. 1, pn junction diodes typically used in Dynamic Random Access Memories ("DRAMs") were created with the substrate. In creating each of the p-n junction diodes, a p-type silicon substrate 1 was used and a p-type well portion and an n-type diffusion layer were formed on the substrate 1. Also, the densities of the p-type well portions respectively formed in the various substrates 1 were identical, and the densities of the n-type diffusion layers were identical to the densities of the p-type well portions. As a result, the different characteristics relating to the structure of the p-n junction diodes were negligible. The acceleration energy and the implantation dose used to implant the boron ions B$^+$ in each of the silicon substrates 1 are shown in the table 1.

In table 1, the "Implantation Dose" value represents the value of the highest boron density in the high density boron layer 5 measured by a Secondary Ion Mass Spectroscopy ("SIMS") measurement method after the high density boron layer 5 is formed via ion implantation. Also, the "Boron Density In Silicon Substrate" value represents the value of the lowest boron density in the silicon substrate 1.

As shown in table 1, the effect of the boron density in the high density boron layer 5 on the gettering capabilities of the semiconductor substrates was studied. Specifically, during the manufacture of the semiconductor substrates of Examples 1 to 4 and Comparative Examples 1 and 2, the acceleration energies used to implant the boron ions were kept constant, and the boron density of the high density boron layer 5 and the silicon substrate 1 were varied in each example and comparative example. Also, the effect of the acceleration energy used to implant the boron ions on the gettering capabilities of the semiconductor substrates was studied. In particular, during the manufacture of the semiconductor substrates of Examples 5 and 6 and Comparative Examples 3 and 4, the boron densities of the high density boron layer 5 and the silicon substrate 1 were kept constant, and the acceleration energies used to implant the boron ions were varied in each example and comparative example.

Also, in Comparative Examples 5 and 6, boron ions were not implanted in the silicon substrate 1, and thus, a high density boron layer 5 was not formed. Also, no polysilicon film 3 was formed on the substrate 1 in Comparative Example 5, and thus, the semiconductor substrate had no gettering layer at all. Also, since Comparative Example 6 contained a polysilicon film 3 but not a high density boron layer 5, the gettering layer consisted of only the polysilicon film 3.

TABLE 1

|  | Acceleration Energy | Implantation Dose | Boron Density in Silicon Substrate | Presence or Absence of Polysilicon Layer at the Rear Face |
|---|---|---|---|---|
| Example 1 | 300 keV | $1 \times 10^{17}/cm^3$ | $1 \times 10^{15}/cm^3$ | presence |
| Example 2 | 300 keV | $1 \times 10^{19}/cm^3$ | $1 \times 10^{15}/cm^3$ | presence |
| Example 3 | 300 keV | $1 \times 10^{19}/cm^3$ | $1 \times 10^{15}/cm^3$ | presence |
| Example 4 | 300 keV | $1 \times 10^{15}/cm^3$ | $1 \times 10^{14}/cm^3$ | presence |
| Comparative Example 1 | 300 keV | $1 \times 10^{15}/cm^3$ | $1 \times 10^{15}/cm^3$ | presence |
| Comparative Example 2 | 300 keV | $1 \times 10^{15}/cm^3$ | $1 \times 10^{17}/cm^3$ | presence |
| Example 5 | 700 keV | $1 \times 10^{19}/cm^3$ | $1 \times 10^{15}/cm^3$ | presence |
| Example 6 | 200 keV | $1 \times 10^{15}/cm^3$ | $1 \times 10^{19}/cm^3$ | presence |
| Comparative Example 3 | 1 keV | $1 \times 10^{19}/cm^3$ | $1 \times 10^{15}/cm^3$ | presence |
| Comparative Example 4 | 100 keV | $1 \times 10^{19}/cm^3$ | $1 \times 10^{15}/cm^3$ | presence |
| Comparative Example 5 | — | — | — | absence |
| Comparative Example 6 | — | — | — | presence |

Figure 3A:
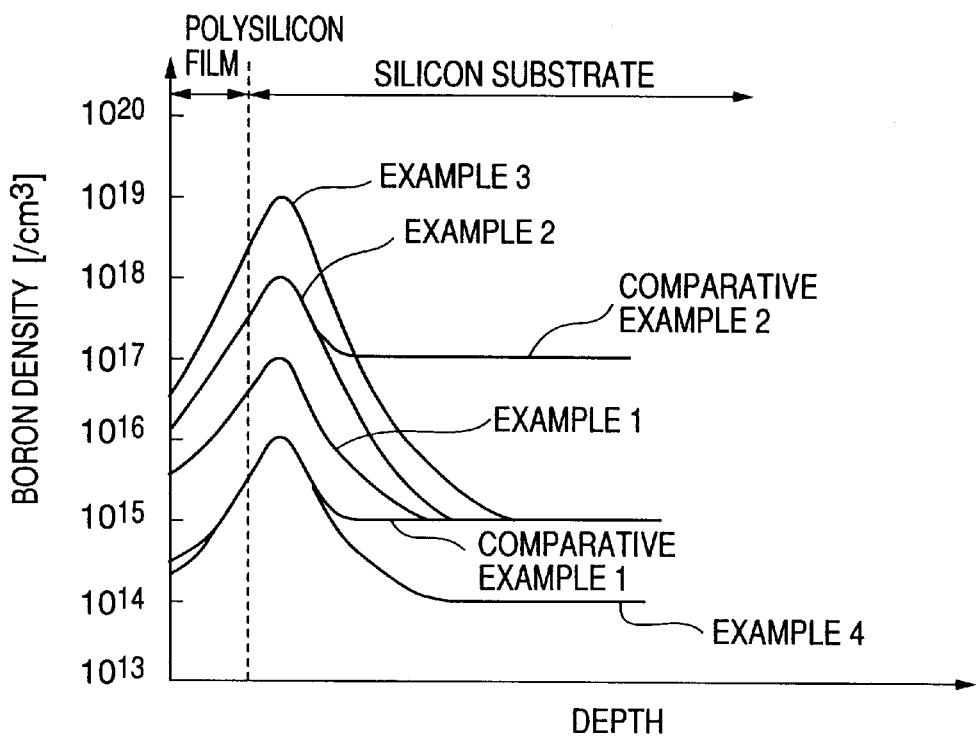
FIG. 3a is a graph illustrating the boron density at various depths of semiconductor substrates according to various examples and comparative examples.
Figure 3B:
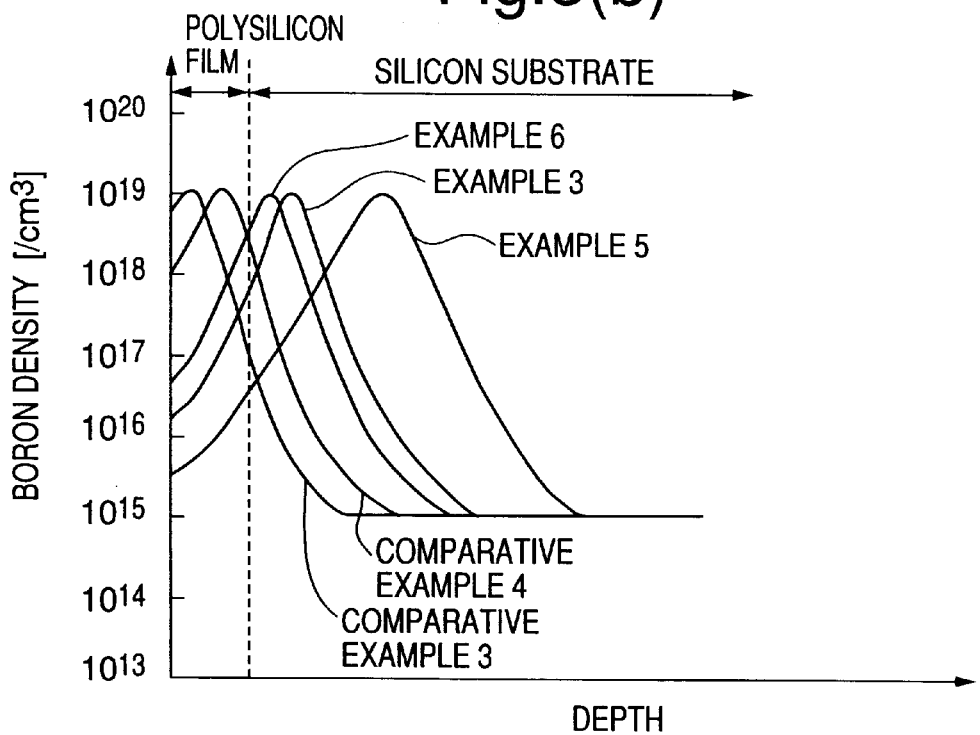
FIG. 3b is a graph illustrating the boron density at various depths of semiconductor substrates according to various examples and comparative examples.

The results of the SIMS measurement method for Examples 1 to 4 and for Comparative Examples 1 and 2 are shown in FIG. 3a. Also, the results of the SIMS measurement method for Examples 3, 5, and 6 and for Comparative Examples 3 and 4 are shown in FIG. 3b.

Figure 4:
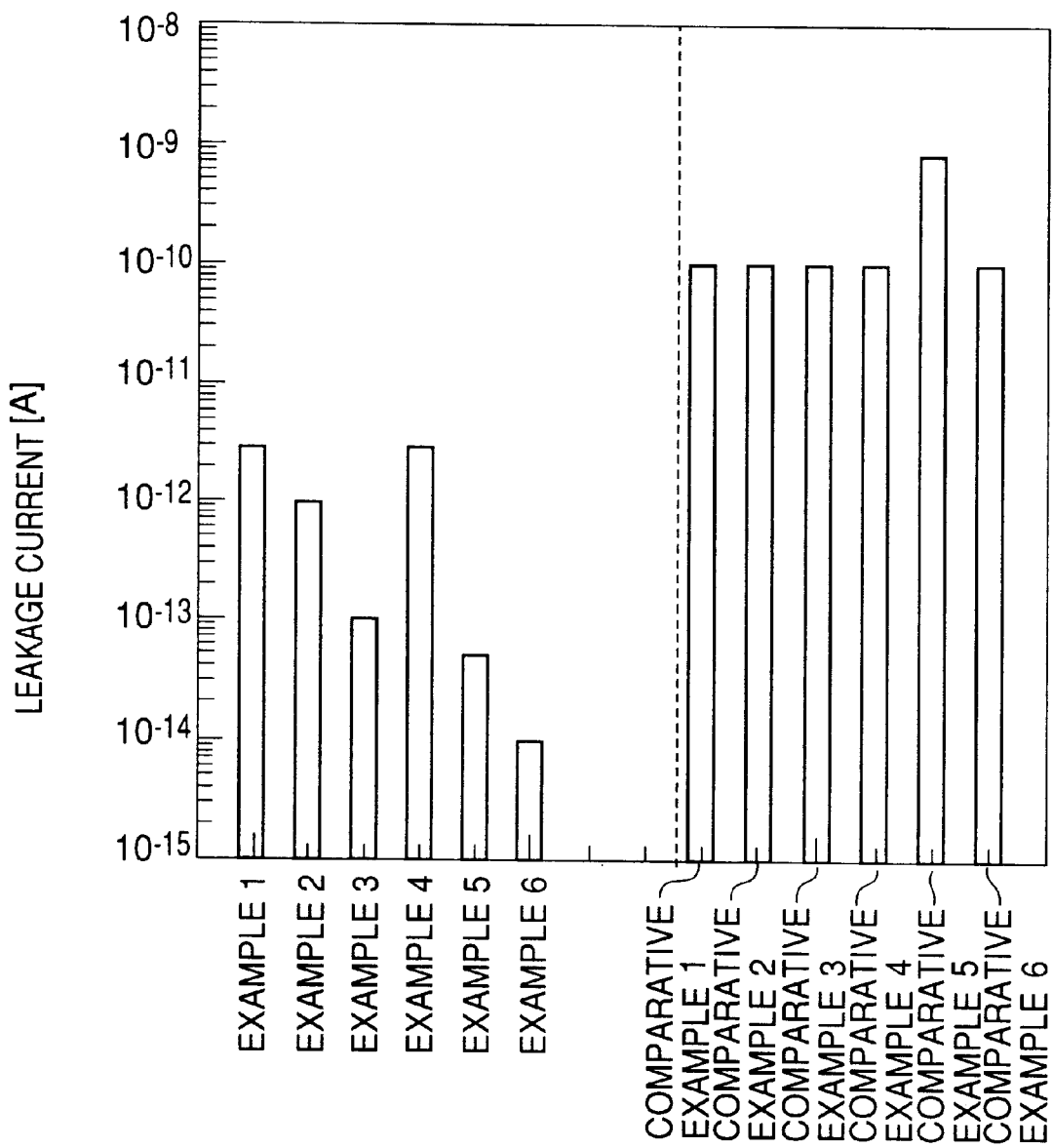
FIG. 4 is a graph illustrating the leakage current of various examples and comparative examples of semiconductor substrates.

FIG. 4 graphically illustrates the amount of leakage current for the p-n junction diodes formed with the substrates created in Examples 1 to 6 and Comparative Examples 1 to 6. Also, FIG. 5 graphically illustrates the iron density in the depletion layers of the p-n junction diodes formed with the substrates created in Examples 1 to 6 and Comparative Examples 1 to 6. The iron densities were measured via a Deep Level Transient Spectroscopy ("DLTS") measurement method.

Figure 5:
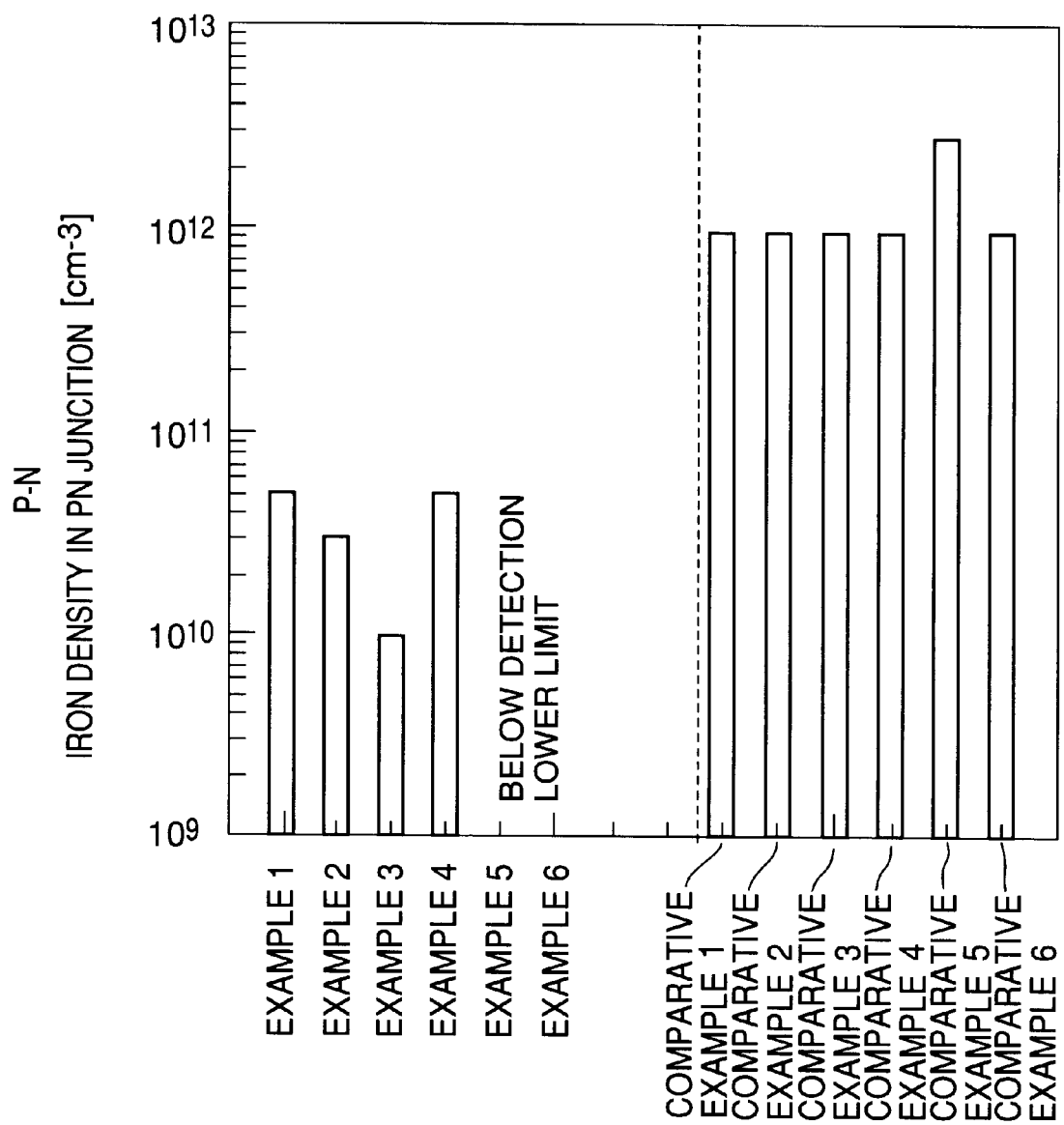
FIG. 5 is a graph illustrating the iron density in the p-n junction of various examples and comparative examples of semiconductor substrates.

As illustrated in FIGS. 4 and 5, both the leak current and the iron density dramatically decreased in all of the p-n junction diodes manufactured with semiconductor substrates of the present embodiment. Such advantageous results were obtained based on the relative boron densities of the high density boron layer 5 and the silicon substrate 1. For example, in Comparative Examples 1 and 2, neither the leak current value nor the iron density is reduced. However, the highest boron density values in the boron layers 5 of Comparative Examples 1 and 2 equal the highest boron density values in the layers 5 of Examples 4 and 2, respectively. Also, the boron density ($10^{18}/cm^3$) in the boron layer 5 of Comparative Example 2 is actually higher than the boron density ($10^{16}/cm^3$) of the boron layer 5 of Example 4. The reason underlying the difference of the leakage current characteristics of Examples 1 to 4 and Comparative Examples 1 and 2 can be seen from the boron density distribution shown in FIG. 3a. In particular, the absolute value of the boron density in the high density boron layer 5 is not necessarily important, but the ratio of the boron density in the layer 5 to the boron density in the silicon substrate 1 determines whether the leak current and the iron density are reduced. As shown in table 1 and FIGS. 4 and 5, the leakage current and iron density are reduced when the ratio is greater than or equal to 100.

However, as shown in Comparative Examples 3 and 4, the ratio between the highest boron density value in the boron layer 5 to the boron density of the silicon substrate 1 is greater than 100, but the leakage current and the iron density are not reduced as shown in FIGS. 4 and 5. As shown in table 1 and FIG. 3b, the acceleration energy with which the boron ions B are implanted in Comparative Examples 3 and 4 is relatively low, and thus, the highest boron density value of the boron layer 5 is located in the polysilicon film 3. Based on such observation, the gettering of the contaminating impurities is not as effective if the highest boron density value of the boron layer 5 is not located in the silicon substrate 1. On the other hand, when the highest boron density value is located in the silicon substrate 1, the contaminating impurities gettered in the polysilicon film 3 cannot permeate through the highest density of boron ions $B^+$ contained in the silicon substrate 1.

The results described above confirm that the re-release of contaminating impurities from the polysilicon film 3 into the operation region of a semiconductor device formed with the semiconductor substrate of the present embodiment can be prevented and that the gettering capabilities can be maintained throughout the manufacturing steps of the semiconductor device if the following two conditions are satisfied. First, the high density boron layer 5 is formed near the boundary 4 between the silicon substrate 1 and the polysilicon film 3 such that the highest boron density in the layer 5 is located in the silicon substrate 1. Second, the ratio of the highest boron density value in the high density boron layer 5 to the lowest boron density value in the silicon substrate 1 is greater than or equal to 100.

A semiconductor substrate according to a second embodiment of the present invention and a method for manufacturing the substrate will be explained below. Also, the second embodiment will be described in conjunction with two different examples referred to as Example 2-1 and Example 2-2.

Figure 6A:
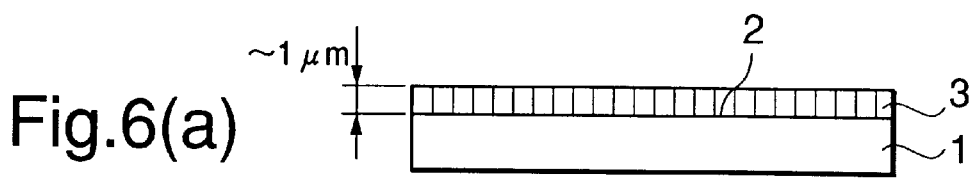
FIG. 6 illustrates a process for manufacturing a semiconductor substrate according to a first example of a second embodiment.
Figure 6B:
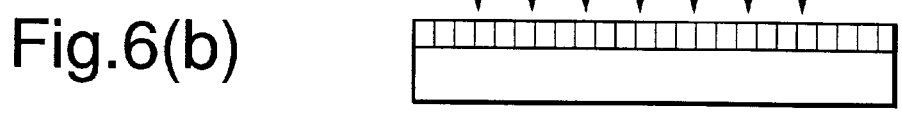

FIG. 6 illustrates a method for manufacturing the semiconductor substrate of Example 2-1. First, a silicon substrate 1 having a first main surface and a second main surface 2 which opposes the first main surface is provided. Then, a polysilicon film 3 having a thickness of approximately 1 µm is formed on the second main surface (i.e. rear face) 2 of the silicon substrate 1 (FIG. 6a). Then, oxygen ions $^{16}O^+$ are ion implanted through the polysilicon film 3 into the silicon substrate 1 (FIG. 6b). During the manufacture of a first semiconductor substrate, the ions $^{16}O^+$ are implanted at an implantation dose of $2 \times 10^{16}/cm^3$ with an acceleration energy of 360 keV. As a result, the highest oxygen density is located in the polysilicon film 3. On the other hand, during the manufacture of a second semiconductor substrate, the ions $^{16}O^+$ are implanted at an implantation dose of $2 \times 10^{16}/cm^3$ with an acceleration energy of 440 keV. As a result, the highest oxygen density is located in the silicon substrate 1 near the boundary between the polysilicon film 3 and the silicon substrate 1. However, the acceleration energy is dependent upon the thickness of the polysilicon film 3, and thus, if the thickness of the film 3 changes, the optimum acceleration energy changes.

Figure 6C:
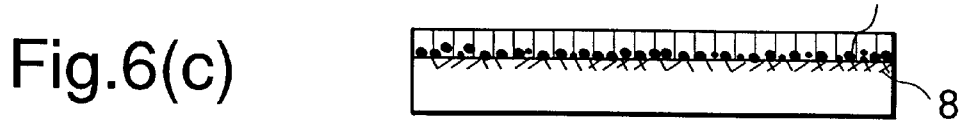

Then, the first and second semiconductor substrates were heated in a nitrogen-oxygen mixed atmosphere at 1000° C. for 8 hours. As a result, in the first semiconductor substrate, only a substantial amount of minute silicon oxide clusters 7 were formed at the boundary between the silicon substrate 1 and the polysilicon film 3. Also, in the second semiconductor substrate, a substantial amount of minute silicon oxide clusters 7 and a substantial amount of dislocations 8 were formed in the silicon substrate 1 at the boundary between the silicon substrate 1 and the polysilicon film 3 (FIG. 6c). The above difference between the two substrates is due to the fact that the ions $^{16}O^+$ were implanted in the first semiconductor substrate with an acceleration energy of 360 keV, whereas the ions $^{16}O^+$ were implanted in the second semiconductor substrate with an acceleration energy of 440 keV.

When a substantial amount of minute silicon oxide clusters 7 are formed at the boundary between the silicon substrate 1 and the polysilicon film 3, they form a silicon oxide film having a depleted region. When the silicon oxide film and/or the substantial amount of dislocations 8 are located at the boundary between the silicon substrate 1 and the polysilicon film 3 they perform a gettering function. As a result, they can prevent the contaminating impurities from being re-released from the polysilicon film 3 to the operating region of the semiconductor device.

In other words, the silicon oxide film and/or dislocations 8 act as a barrier layer which enables heavy metal and other impurities to diffuse from the substrate 1 to the polysilicon film 3 and to be absorbed by the film 3. Also, if and when the film 3 recrystallizes, the silicon oxide film and/or dislocations 8 prevent the impurities released from the film 3 from diffusing back into the silicon substrate 1. Thus, the impurities do not contaminate the operating region of a semiconductor device when the device is formed on the substrate 1. In addition, the silicon oxide film and/or dislocations 8 may actually perform an additional gettering function and absorb the impurities from the substrate 1.

Figure 7A:
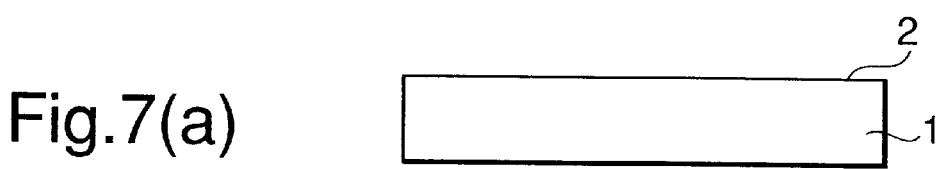
FIG. 7 illustrates a process for manufacturing a semiconductor substrate according to a second example of the second embodiment.
Figure 7B:
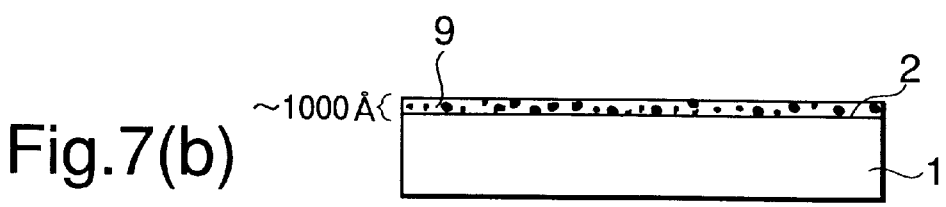

FIG. 7 illustrates a method for manufacturing the semiconductor substrate of Example 2-2. As in the case of Example 2-1, a silicon substrate 1 having a first main surface and a second main surface 2 which opposes the first main surface is provided (FIG. 7a). Then, nitrogen oxide ($N_2O$) and silane ($SiH_4$) are applied to the second main surface (i.e. the rear face) 2 of the silicon substrate 1 at 650° C. and at a density ratio in the flow rate of 0.05:10 to form a polysilicon layer 9 having a thickness of approximately 1000 Å and containing substantial amount of silicon oxide clusters (FIG. 7b).

Figure 7C:
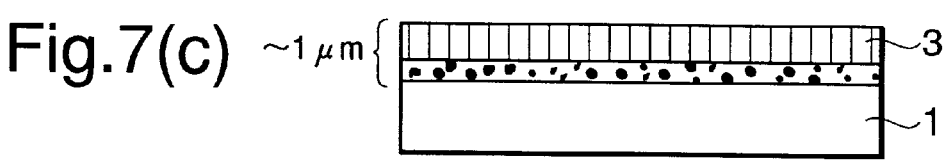

Afterwards, a polysilicon film 3 is formed on the polysilicon layer 9 at 650° C. in an $SiH_4$ atmosphere (FIG. 7c). In the present example, the polysilicon film 3 is formed such that the combined thickness of the polysilicon layer 9 and the polysilicon film 3 is approximately 1 $\mu$m.

Since a lot of silicon oxide clusters in the polysilicon layer 9 are formed at the boundary between the silicon substrate 1 and the polysilicon film 3, the gettering capabilities of the semiconductor substrate is improved. Thus, the re-release of the contaminating impurities from the polysilicon film 3 into the operation region of the semiconductor device can be prevented. Specifically, the layer 9 acts as a barrier layer which enables heavy metal and other impurities to diffuse from the substrate 1 to the polysilicon film 3 and to be absorbed by the film 3. Also, if and when the film 3 recrystallizes, the layer 9 prevents the impurities released from the film 3 from migrating back into the silicon substrate 1. Thus, the impurities do not contaminate the operating region of a semiconductor device when the device is formed on the substrate 1.

The gettering capabilities of the semiconductor substrates of Example 2-1 and Example 2-2 were examined, and the results are shown in the following Table 2. In order to evaluate the gettering capabilities of the substrates, p-n junction diodes typically used in DRAMs were formed on the substrates, and the iron density in the depletion layer of the pn junction diodes was measured by the DLTS measuring method. Such method is identical with the method described above in conjunction with Table 1. Also, the Comparative Examples 5 and 6 shown in Table 2 are identical with the Comparative Examples 5 and 6 shown in Table 1. Specifically, the substrate of Comparative Example 5 has no polysilicon film 3 on the rear face 2 of the silicon substrate 1 and thus, has no gettering layer at all. Also, the substrate of Comparative Example 6 does not have an additional layer between the silicon substrate 1 and the polysilicon film 3, and thus, only the polysilicon film 3 acts as a gettering layer. Also, as shown in table 2, the substrate of Comparative Example 7 does not have an additional layer formed between the silicon substrate 1 and the polysilicon layer 3, and thus, only the polysilicon film 3 acts as a gettering layer. Moreover, the polysilicon film 3 is peeled away during the course of manufacturing the DRAM.

TABLE 2

| Specimen | Remarks | Presence or absence of polysilicon at rear face | Iron density [/cm$^3$] |
|---|---|---|---|
| Example 2-1 | Implanted energy: 360 kev | presence | 1 × 10$^{11}$ |
| Example 2-1 | Implanted energy: 440 kev | presence | 6 × 10$^{10}$ |
| Example 2-2 | — | presence | 8 × 10$^{10}$ |
| Comp. Example 5 | — | absence | 2 × 10$^{12}$ |
| Comp. Example 6 | — | presence | 1 × 10$^{12}$ |
| Comp. Example 7 | — | presence as far as midway | 8 × 10$^{11}$ |

As shown in Table 2, the semiconductor substrates of Examples 2-1 and 2-2 have excellent gettering capabilities in comparison to the semiconductor substrates of Comparative Examples 5 and 6, and thus, the iron density in the p-n junction depletion layers is dramatically lowered. Also, as noted in the table, the iron density of the pn junction formed by the first substrate in Example 2-1 (i.e. the semiconductor substrate in which oxygen ions $^{16}O^+$ were implanted at an acceleration energy of 360 keV) is higher than the iron density of the p-n junctions formed by the second substrate of Example 2-1 (i.e. the semiconductor substrate in which oxygen ions $^{16}O^+$ were implanted at an acceleration energy of 440 keV). The difference between the iron densities is due to that fact that the increased acceleration energy used to implant the ions caused dislocations 8 to be formed in the silicon substrate 1 in addition to the silicon oxide clusters 7 (FIG. 6c). As a result, both the dislocations 8 and the clusters 7 act as gettering layers. Furthermore, as illustrated by Comparative Example 7, the amount of iron detected in the semiconductor device is higher when the polysilicon layer 3 is peeled away from the silicon substrate 1 during the course of manufacturing the DRAM. Thus, in order to optimally reduce the iron content, the gettering capabilities of a semiconductor substrate should be maintained throughout the manufacturing process.

As described above, the contaminating impurities can be prevented from being re-released from the polysilicon film 3 of a semiconductor substrate into the operating region of a semiconductor device formed with the substrate by: (1) forming a silicon oxide film having a depleted region between the polysilicon film 3 and the silicon substrate 1, (2) forming a silicon oxide film having a depleted region and forming a substantial amount of dislocations 8 between the polysilicon film 3 and the silicon substrate 1, or (3) forming a polysilicon layer 9 having silicon oxide clusters between the polysilicon film 3 and the silicon substrate 1. Also, the gettering capabilities of the semiconductor substrate can be maintained throughout the entire process of manufacturing semiconductor devices.

According to the present invention, it is possible to create a semiconductor substrate having improved gettering capabilities which are maintained throughout the manufacturing process of the semiconductor devices. Also, it is possible to prevent contaminating impurities which have previously been gettered from being released again into the operating region of the semiconductor device. Furthermore, the present invention also provides a method of manufacturing a semiconductor substrate having improved gettering capabilities.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed:

1. A semiconductor substrate, comprising:
   a substrate having a first main surface and a second main surface opposed to said first main surface, wherein said substrate is used to form a semiconductor device at least indirectly on said first main surface;
   a polysilicon film formed at least indirectly on said second main surface; and
   a barrier layer disposed between said substrate and said polysilicon film which allows heavy metal impurities to travel from said substrate to said polysilicon film and which prevents heavy metal impurities from travelling from said polysilicon film to said substrate.

2. A semiconductor substrate as claimed in claim 1, wherein said barrier layer comprises:
   a high density boron layer disposed between said substrate and said polysilicon film, wherein a ratio of a highest boron density value in said high density boron layer to a lowest boron density value in said substrate is greater than or equal to approximately 100.

3. The semiconductor substrate as claimed in claim 2, wherein said high density boron layer is formed by implanting boron ions in said substrate such that said high density boron layer is formed from a portion of said substrate.

4. The semiconductor substrate as claimed in claim 3, wherein said polysilicon film is disposed directly adjacent to said high density boron layer.

5. The semiconductor substrate as claimed in claim 4, wherein a portion of said high density boron layer containing said highest boron density value is located closer to said substrate than to said polysilicon film.

6. The semiconductor substrate as claimed in claim 2, wherein said highest boron density value is greater than or equal to approximately $1 \times 10^{16}/cm^3$.

7. The semiconductor substrate as claimed in claim 4, wherein said highest boron density value is greater than or equal to approximately $1 \times 10^{16}/cm^3$.

8. The semiconductor substrate as claimed in claim 7, wherein an acceleration energy with which said boron ions are implanted is at least approximately 200 keV.

9. A semiconductor substrate as claimed in claim 1, wherein said barrier layer comprises:
   a silicon oxide film having a depleted region formed between said substrate and said polysilicon film.

10. The semiconductor substrate as claimed in claim 9, wherein said silicon oxide film comprises a plurality of dislocations.

11. The semiconductor substrate as claimed in claim 9, wherein said silicon oxide film is formed by implanting oxygen ions in said substrate such that said silicon oxide film is formed from a portion of said substrate.

12. The semiconductor substrate as claimed in claim 10, wherein said silicon oxide film is formed by implanting oxygen ions in said substrate such that said silicon oxide film is formed from a portion of said substrate.

13. The semiconductor substrate as claimed in claim 11, wherein an acceleration energy with which said oxygen ions are implanted is at least approximately 360 keV.

14. The semiconductor substrate as claimed in claim 12, wherein an acceleration energy with which said oxygen ions are implanted is at least approximately 440 keV.

15. The semiconductor substrate as claimed in claim 1, wherein said barrier layer comprises:
   a polysilicon layer containing a plurality of silicon oxide clusters, wherein said polysilicon layer is formed at least indirectly on said second main surface of said substrate,
   wherein said polysilicon film formed at least indirectly on said polysilicon layer.

16. The semiconductor substrate as claimed in claim 15, wherein said polysilicon layer is formed directly on said second main surface and said polysilicon film is formed directly on said polysilicon layer.

17. The semiconductor substrate as claimed in claim 15, wherein said polysilicon layer is formed by applying nitrogen oxide and silane at least indirectly to said second main surface at a density ratio in a flow rate of 0.05 to 10.

18. The semiconductor substrate as claimed in claim 15, wherein a combined thickness of said polysilicon layer and said polysilicon film is at least approximately 1 µm.

19. A semiconductor substrate as claimed in claim 1, wherein said heavy metals comprise at least one of iron, nickel, and copper.

* * * * *

UNITED STATES PATENT AND TRADEMARK OFFICE
CERTIFICATE OF CORRECTION

PATENT NO. : 6,300,680 B1
DATED : October 9, 2001
INVENTOR(S) : Mitsuhiro Horikawa et al.

It is certified that error appears in the above-identified patent and that said Letters Patent is hereby corrected as shown below:

Column 1,
Line 37, delete "io"

Column 7,
Table 1, under "Implantation Dose"
Example 2, delete "1 x $10^{19}$/cm$^3$" insert -- 1 x $10^{18}$/cm$^3$ --
Example 4, delete "1 x $10^{15}$/cm$^3$" insert -- 1 x $10^{16}$/cm$^3$ --;
Comparative Example 1, delete "1 x $10^{15}$/cm$^3$" insert -- 1 x $10^{16}$/cm$^3$ --;
Comparative Example 2, delete "1 x $10^{15}$/cm$^3$" insert -- 1 x $10^{18}$/cm$^3$ --;
Example 6, delete "1 x $10^{15}$/cm$^3$" insert -- 1 x $10^{19}$/cm$^3$ --

Column 10,
Table 2, line 23, delete (in the 2$^{nd}$ column heading) delete "of polysilicon at";
Line 23, delete "Iron density" insert -- of polysilicon at --

Signed and Sealed this

Thirty-first Day of December, 2002

JAMES E. ROGAN
*Director of the United States Patent and Trademark Office*